(12) United States Patent
Milo et al.

(10) Patent No.: US 10,964,629 B2
(45) Date of Patent: Mar. 30, 2021

(54) SIDERAIL WITH MOLD COMPOUND RELIEF

(71) Applicant: TEXAS INSTRUMENTS INCORPORATED, Dallas, TX (US)

(72) Inventors: Dolores Babaran Milo, Baguio (PH); Richard Diestro Sumalinog, Pampanga (PH); Ruby Ann Merto Camenforte, Pampanga (PH); Sylvester Tigno Sanchez, Pampanga (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 113 days.

(21) Appl. No.: 16/252,092

(22) Filed: Jan. 18, 2019

(65) Prior Publication Data
US 2020/0235043 A1 Jul. 23, 2020

(51) Int. Cl.
*H01L 23/495* (2006.01)
*H01L 21/48* (2006.01)
*H01L 21/56* (2006.01)
*H01L 23/00* (2006.01)

(52) U.S. Cl.
CPC .... *H01L 23/49565* (2013.01); *H01L 21/4842* (2013.01); *H01L 21/561* (2013.01); *H01L 21/565* (2013.01); *H01L 24/97* (2013.01); *H01L 2224/48247* (2013.01)

(58) Field of Classification Search
CPC ..... H01L 23/49565; H01L 2224/48247; H01L 24/97; H01L 21/561; H01L 23/49575; H01L 23/49541; H01L 2924/181; H01L 21/565; H01L 23/49503; H01L 23/495; H01L 21/4842; H01L 23/49537; H01L 23/49524; H01L 2224/40247; H01L 2224/3716; H01L 2224/37147; H01L 23/3107; H01L 2224/97; H01L 2224/40105; H01L 2924/00014; H01L 2924/013; H01L 2924/01028; H01L 2224/84

See application file for complete search history.

(56) References Cited

U.S. PATENT DOCUMENTS

| | | | |
|---|---|---|---|
| 7,838,340 B2 | 11/2010 | Cruz et al. |
| 8,049,312 B2 | 11/2011 | Herbsommer et al. |
| 8,058,107 B2 | 11/2011 | Cruz et al. |
| 8,304,903 B2 | 11/2012 | Herbsommer et al. |
| 9,136,256 B2 | 9/2015 | Joshi |
| 9,355,942 B2 | 5/2016 | Samson et al. |

(Continued)

*Primary Examiner* — Jasmine J Clark
(74) *Attorney, Agent, or Firm* — Dawn Jos; Charles A. Brill; Frank D. Cimino (57) ABSTRACT

A method of manufacturing a semiconductor package includes attaching semiconductor dies to an array of leadframes and positioning a clip array in alignment with the array of leadframes within a mold cavity, the clip array including clips that electrically connect to at least some of the semiconductor dies and a siderail along a perimeter of the clip array. The siderail forms a set of reliefs extending from an outer edge of the siderail to an inner edge of the siderail, the inner edge being adjacent to the array of leadframes. The method also includes injecting a mold compound into the mold cavity through a flow path including the set of reliefs of the siderail to form a mold block at least partially covering the semiconductor dies.

20 Claims, 8 Drawing Sheets

(56) References Cited

U.S. PATENT DOCUMENTS

| | | |
|---|---|---|
| 9,496,208 B1 | 11/2016 | Ostrowicki |
| 9,691,748 B2 | 6/2017 | Eugene Lee et al. |
| 9,698,085 B1 | 7/2017 | Cari-an et al. |
| 2011/0121461 A1* | 5/2011 | Lim ........................ H01L 24/97 257/773 |
| 2013/0140737 A1 | 6/2013 | Keong |

* cited by examiner

FIG. 7

SIDERAIL WITH MOLD COMPOUND RELIEF

TECHNICAL FIELD

This disclosure relates to semiconductor packages.

BACKGROUND

Packaged electronic assemblies, such as packaged integrated circuits, generally include a leadframe including leads and pads for one or more dies, a plastic or resin package that protects the dies, and electrical connections between the dies and leads.

In a transfer molding process to form a package, mold compound (plastic or resin) is injected to fill cavity molds containing die and leadframe assemblies. The mold compound cures around the die and leadframe assemblies to form protective packages for the electronic assemblies.

For package molding applications, mold compounds may be thermoset compounds that include an epoxy novolac resin or similar material combined with a filler, such as alumina, and other materials to make the compound suitable for molding, such as accelerators, curing agents, filters, and mold release agents.

BRIEF SUMMARY

This disclosure includes techniques for transfer molding packages for electronic assemblies. The disclosed techniques include mold compound reliefs in siderails of clip arrays or leadframes strips of the electronic assemblies. The disclosed techniques provide an increased mold compound flow path area past the siderail during a transfer molding process compared to techniques without such reliefs. The disclosed techniques may thereby limit pressure buildup during transfer molding process used to form the protective packages.

In one example, a method of manufacturing a semiconductor package comprises attaching semiconductor dies to an array of leadframes and positioning a clip array in alignment with the array of leadframes within a mold cavity, the clip array including clips that electrically connect to at least some of the semiconductor dies and a siderail along a perimeter of the clip array. The siderail forms a set of reliefs extending from an outer edge of the siderail to an inner edge of the siderail, the inner edge being adjacent to the array of leadframes. The method also comprises injecting a mold compound into the mold cavity through a flow path including the set of reliefs of the siderail to form a mold block at least partially covering the semiconductor dies.

In another example, a method of manufacturing a semiconductor package comprises injecting a mold compound into a mold cavity through a flow path to form a mold block. The mold cavity contains: semiconductor dies attached to an array of leadframes, and a clip array in alignment with the array of leadframes, the clip array including clips that electrically connect to at least some of the semiconductor dies and a siderail along a perimeter of the clip array. The siderail includes multiple straight segments arranged in a rectangle surrounding the clips of the clip array, the siderail forming a set of reliefs extending from an outer edge of the siderail to an inner edge of the siderail, the inner edge being adjacent to the array of leadframes. The flow path includes the set of reliefs of the siderail, and the mold block at least partially covers the semiconductor dies. The method also comprises singulating the mold block to separate the semiconductor package from the siderail and from other semiconductor packages contained within the mold block, the semiconductor package including one or more of the semiconductor dies and one or more of the clips.

In another example, a semiconductor package clip structure comprises a clip array formed from a substrate providing a thickness. The clip array includes clips interconnected in an array, and a siderail along a perimeter of the clip array, wherein the siderail forms a set of reliefs extending from an outer edge of the siderail to an inner edge of the siderail, the inner edge being adjacent to the clips. Reliefs of the set of reliefs are partial etches in the substrate. The siderail includes multiple straight segments arranged in a rectangle. The reliefs provide depths of at least a third of the thickness of the substrate. Combined widths of the reliefs cover at least a third of a length of one segment of the multiple straight segments.

DETAILED DESCRIPTION

Transfer molding processes to form packaged electronic assemblies, such as packaged integrated circuits, include injection molding to cover a leadframe strip, electronic components, and electric connections therebetween, such as solder connections, wire bonds, and/or clip arrays or other metal clips. Prior to singulation, siderails generally surround the leadframe and/or clip arrays to support their substrates as well as facilitate alignment of the leadframe and clip arrays.

During a transfer molding process to form packaged electronic assemblies, restrictions in the flow path of mold compound may cause excessive flow pressure leading to mold flash. Mold flash is generally undesirable as it may require reprocessing to remove the mold flash from electrical contacts of affected packaged electronic assemblies or outright rejection of such affected packaged electronic assemblies, thereby increasing the cost and/or failure rate of the manufacturing process.

Reducing restrictions in a flow path of mold compound during a transfer molding process may limit pressure buildup thereby mitigating undesirable mold flash. As disclosed herein, including one or more reliefs in a siderail adjacent the gate area of the mold cavity increases the mold compound flow path area past the siderail, and may thereby reduce pressure buildup and resulting mold flash during transfer molding. Siderails 122, 132 of FIGS. 1A-1C represent example siderails including reliefs that may limit pressure buildup during a transfer molding process.

Figure 1A:
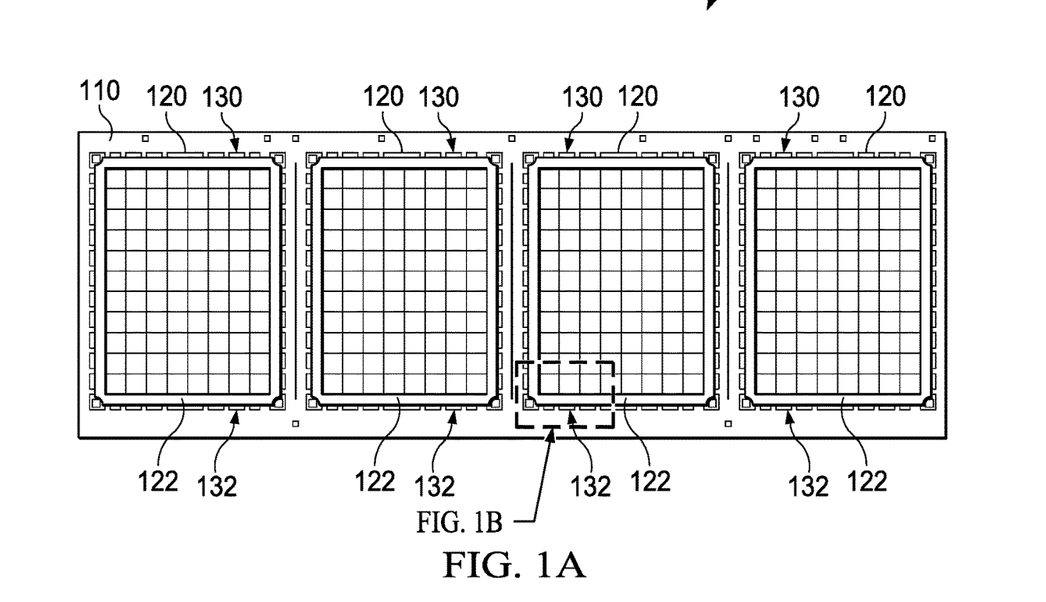
FIG. 1A is a perspective view of a subassembly of a semiconductor package strip, the subassembly including a substrate forming a leadframe strip providing an array of leadframes, dies mounted on the leadframes, and two clip arrays with siderails.
Figure 1B:
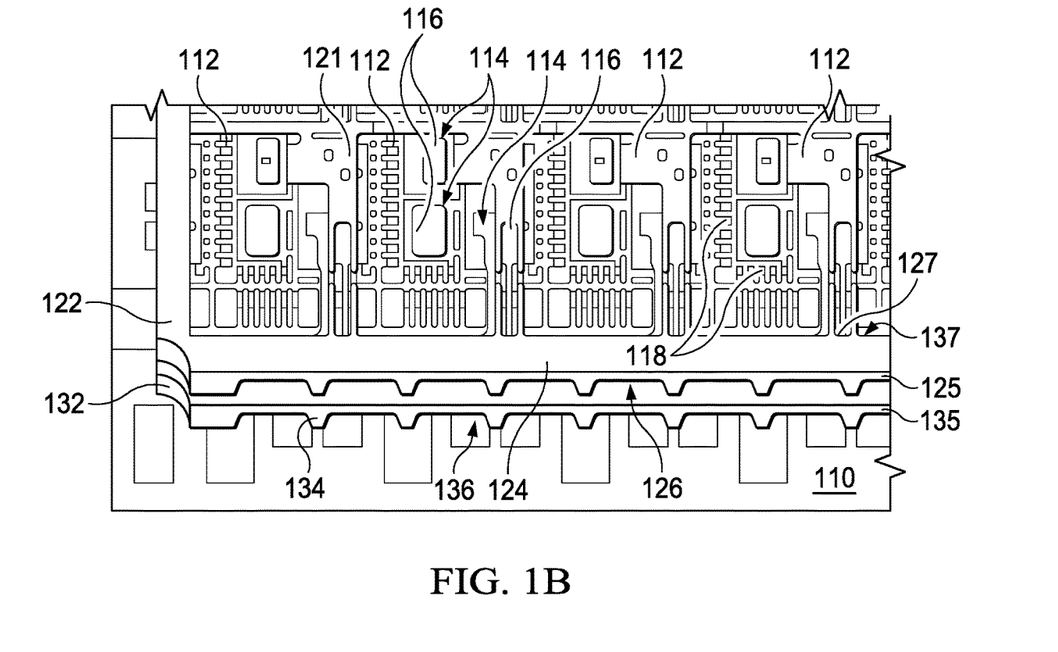
FIG. 1B is an enlarged perspective view of a portion of the subassembly of FIG. 1A illustrating sets of reliefs in the siderails of the clip arrays, the reliefs increasing a mold compound flow path area past the siderail during a transfer molding process.
Figure 1C:
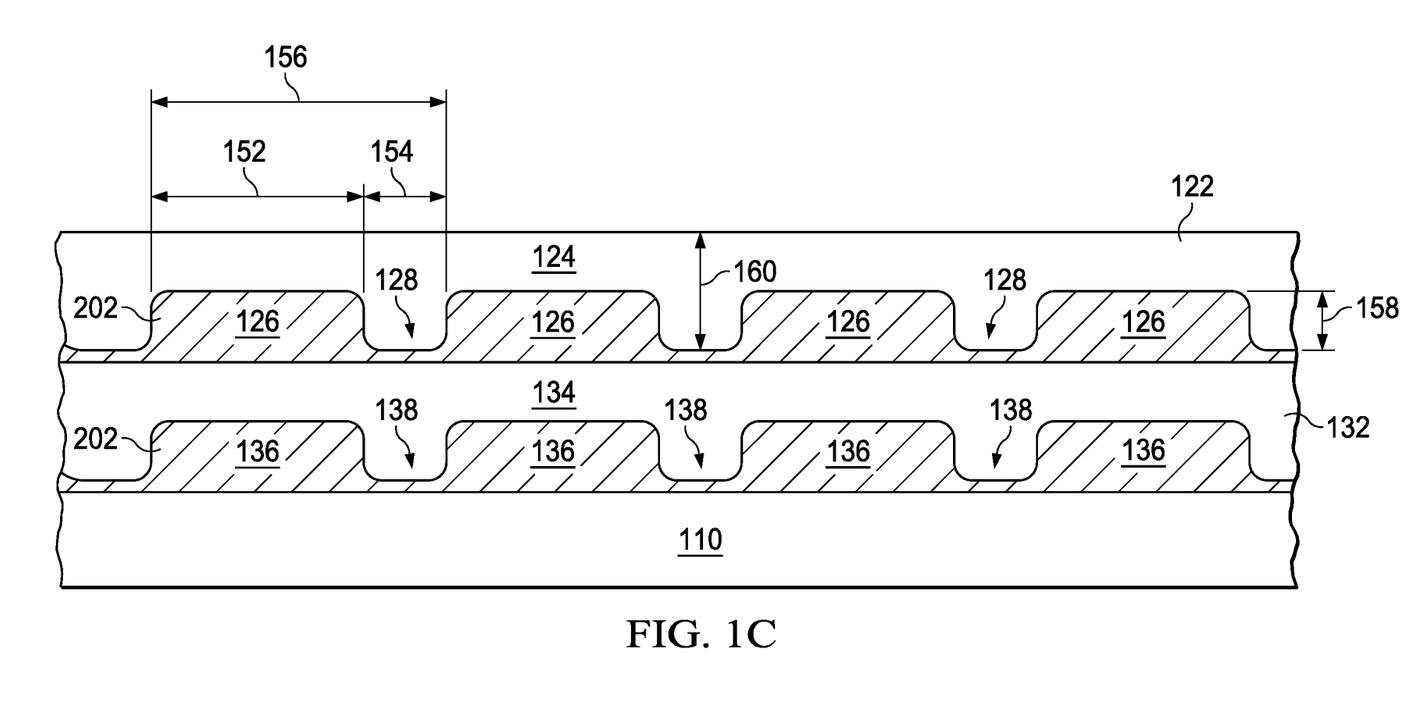
FIG. 1C is a side view of a portion the subassembly of FIGS. 1A and 1B illustrating reliefs in the siderails of the clip arrays.

FIG. 1A is a perspective view of a subassembly 102 of a semiconductor package strip 100. Subassembly 102 includes a substrate 110 with an array of leadframes 112, semiconductor dies 116 attached to pads 114 of leadframes 112, and two clip arrays 120, 130 with siderails 122, 132 respectively. FIG. 1B is an enlarged perspective view of a portion of subassembly 102 including siderails 122, 132. FIG. 1C is a side view of a portion of front segments 124, 134 of siderails 122, 132, as well as leadframe substrate 110.

Semiconductor package strip 100 includes four mold blocks 104 (FIG. 2A), each mold block 104 containing a subset of the array of leadframes 112 of semiconductor package strip 100. In the specific example of semiconductor package strip 100, the subset of the array of leadframes 112 of each mold block 104 is eight leadframes across (adjacent to front segments 124, 134 of siderails 122, 132) by eleven leadframes deep, for a total of eighty-eight leadframes in each mold block 104.

Leadframes, such as leadframes 112, are formed on a single sheet of metal by stamping or etching. Multiple interconnected leadframes may be formed from a single sheet of substrate, the interconnected leadframes referred to as a leadframe strip. Leadframes on the sheet can be arranged in rows and columns. Tie rails interconnect leads and other elements of a leadframe to one another as well as to elements of adjacent leadframes in a leadframe strip. A siderail may surround the array of leadframes to provide rigidity and support leadframe elements on the perimeter of the leadframe strip. The siderail may also include alignment features to aid in manufacturing.

Usually die mounting, die to lead attachment, such as wire bonding, and molding to cover at least part of the leadframe and dies take place while the leadframes are still integrally connected as a leadframe strip. After such processes are completed, the leadframes, and sometimes mold compound of a package, are severed ("singulated" or "diced") with a cutting tool, such as a saw or laser. These singulation cuts separate the leadframe strip into separate semiconductor packages, each semiconductor package including a singulated leadframe, at least one die, electrical connections between the die and leadframe (such as gold or copper bond wires) and the mold compound which covers at least part of these structures.

Tie rails and siderails may be removed during singulation of the packages. The term leadframe of represents the portions of the leadframe strip remaining within a package after singulation. With respect to semiconductor package strip 100, each leadframe 112 includes pads 114 and leads 118 although those elements are not interconnected following singulation of discrete packages 106.

Leadframes 112 physically and electrically connect dies 116 to external circuitry, such as printed circuit boards, via pads 114 and leads 118 respectively. In this example, each package 106 includes three pads 114 with dies 116 mounted thereon. Following molding, one or more pads 114 may function as an exposed thermal pad to facilitate cooling of electronic components of the packages 106 during operation. In addition, electrical contacts of leads 118 are exposed after molding to facilitate electrical connections with the electronic components of the packages 106. In some specific examples, packages 106 represent synchronous buck controllers, such as multiphase synchronous buck controllers.

Following singulation of mold blocks 104 to form discrete packages 106, leads 118 are located along the perimeter of the resulting discrete packages 106. In this manner, packages 106 represent flat no-leads packages, and more specifically, quad-flat no-leads (QFN) due to the presence of leads 118 on each of the four sides of the package. These and other surface mount technologies serve to connect electronic assemblies, such as integrated circuits, to printed circuit boards without through-holes. While the particular packages described herein represent QFN packages, the disclosed techniques may be applied to any transfer molding process with a substrate including a siderail, such as dual-flat no-leads (DFN) and may be particularly advantageous to any packages utilizing clips.

Figure 2A:
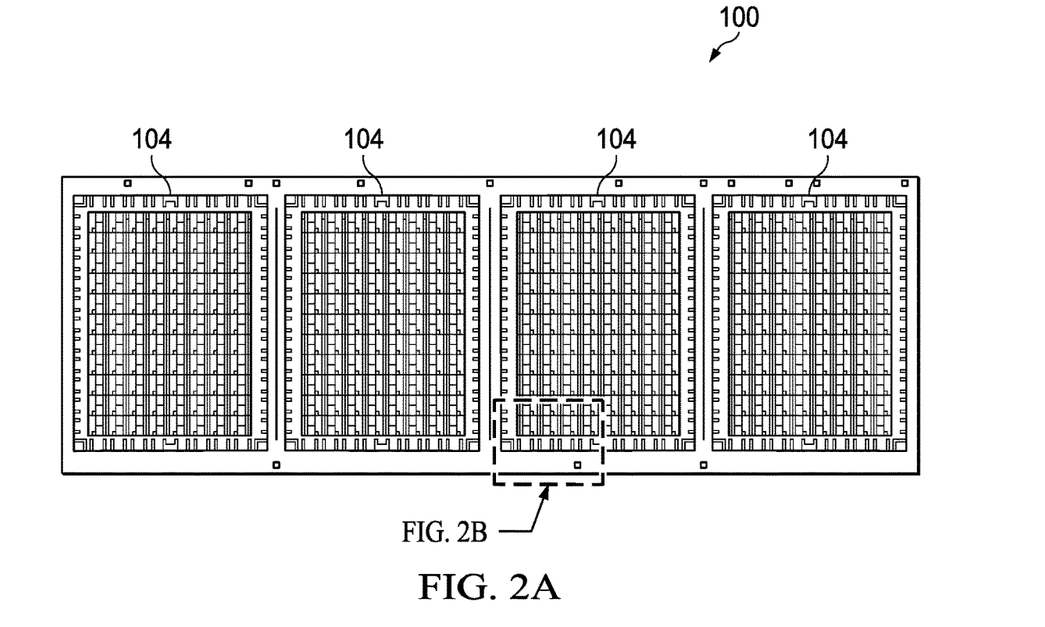
FIG. 2A is a perspective view of a semiconductor package strip with four mold blocks, the semiconductor package strip including the subassembly of FIG. 1A.

Following a transfer molding process, each of leadframes 112 is contained within one of an array of interconnected packages 106 of semiconductor package strip 100 (FIG. 2A). Clip arrays 120, 130 each include clips corresponding to the array of leadframes 112, such that individual clips provide electrical connections between semiconductor dies 116, and/or between semiconductor dies 116 and leadframe 112 within a package 106. In this manner, clip arrays 120, 130 each represent a semiconductor package clip structure for semiconductor package strip 100. FIG. 1B specifically identifies a representative clip 121 of top clip array 120. Each clip, such as clip 121, in clip arrays 120, 130 are generally shaped to include a flat area for contacting a die terminal and, at an angle to the flat area, a ridge for reaching a contact pad 114 or leadframe lead 118.

Clip arrays 120, 130 are positioned in alignment with the array of leadframes 112 such that individual clips align with electrical contacts of the leadframes and dies mounted on individual leadframes. In this alignment, bottom clip array 130 is in a stacked arrangement adjacent to leadframes 112 and top clip array 120 is in a stacked arrangement over bottom clip array 130 relative to leadframes 112. In other examples, a package may also include clips on opposing sides of a leadframe. In such examples, one or more sides of the leadframe could include a stacked arrangement of clips, or just a single clip per side. Like leadframes 120, clip arrays 120, 130 are divided into sections corresponding to more than one mold block 104, such as the four mold blocks 104 of semiconductor package strip 100.

Other arrangements are also possible. In various examples, electrical connections between dies 116 may be formed with solder connections, wire bonds, and/or the clips included as part of clip arrays 120, 130. In the same or different examples, each package 106 may include dies on more than one level connected by solder connections, wire bonds, and/or metal clips.

Figure 2B:
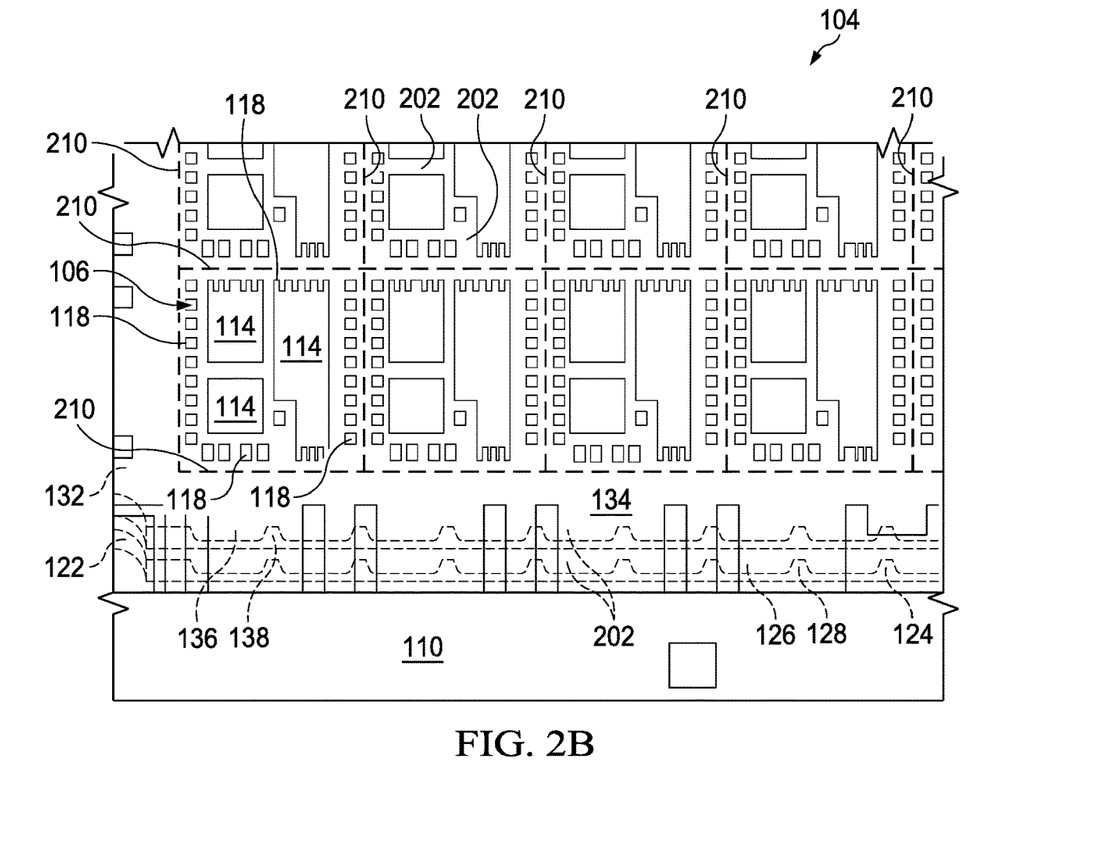
FIG. 2B is an enlarged perspective view of a portion of the semiconductor package strip of FIG. 2A illustrating mold compound within the reliefs in the siderails of the clip arrays.
Figure 3A:
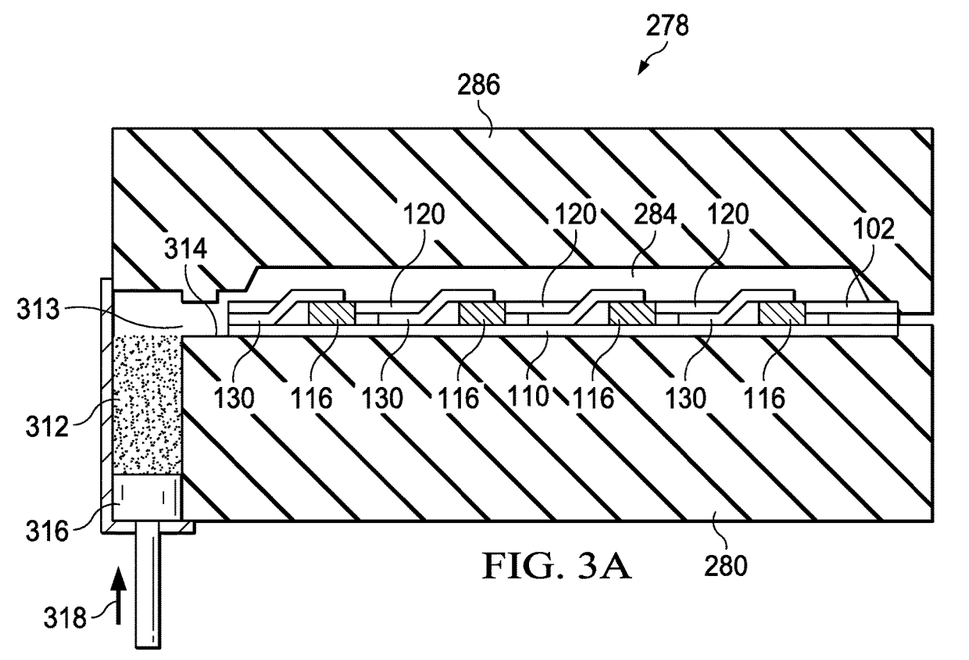
FIGS. 3A and 3B are schematic diagrams providing cross sectional views of a transfer mold press during a transfer molding process including the subassembly of FIG. 1A.

As described in further detail with respect to FIG. 3, during a transfer molding process to form mold blocks 104 (FIG. 2A), front segments 124, 134 of siderails 122, 132 are positioned adjacent the gate area of the mold cavity. Excess pressure in the gate area of the mold cavity may result in undesirable mold flash covering electrical contacts (shown in FIG. 2B) of leads 118 in packages 106 adjacent the gate area. Reliefs 126, 136 are mold compound reliefs in that they increase the mold compound flow path area. Specifically, reliefs 126, 136 increase the mold compound flow path area in the vicinity of front segments 124, 134 of siderails 122, 132, to mitigate pressure buildup and resulting mold flash during the transfer molding process for packages 106.

Clip arrays 120, 130 can be formed in batch processes. For example, the structure of clip arrays 120, 130 may be formed by etching or stamping a metal substrate sheet providing a substantially consistent thickness. In this context, consistent thickness means within the limits of manufacturing tolerances of substrate sheet materials suitable for use in forming clip arrays 120, 130 in the batch processes. In at least one example, only if a thickness varies no more than ten percent (10%), is the thickness a substantially consistent thickness.

Figure 5:
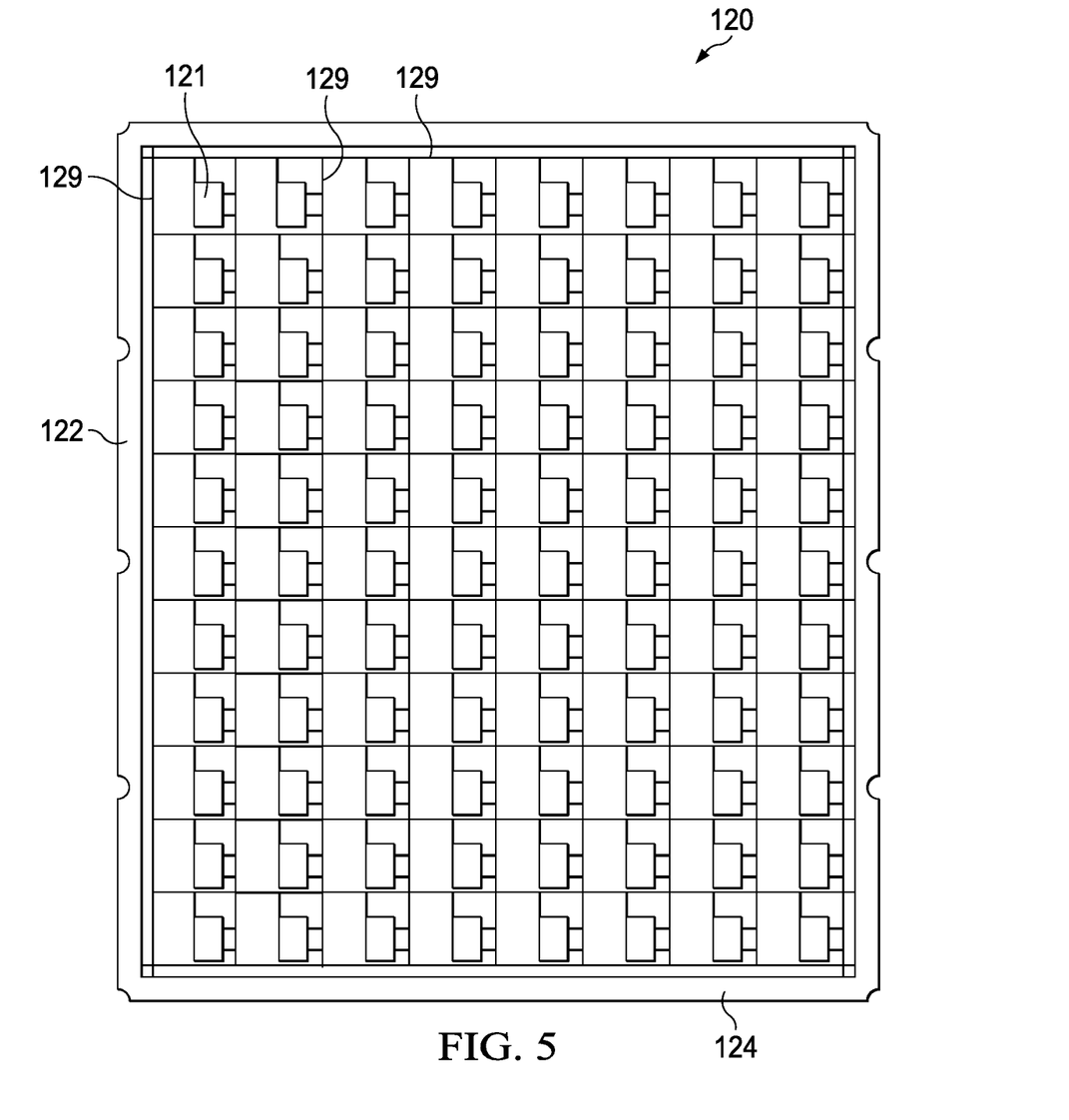
FIG. 5 is a top view of a clip array for a single mold block.

Clip arrays 120, 130, including the network of arrayed clips, with siderails 122, 132 providing an outer frame for each mold block 104, are each manufactured from a single sheet of metal substrate. Clip arrays 120, 130 each include clips in array corresponding to the array of leadframes 112 and supported by siderails 122, 132. Inside the siderails 122, 132, each clip of the array is positioned within a discrete rectangle of tie rails, held in position by tie rails to the rails. Each clip shares its tie rails with the nearest adjacent clips. One example of this arrangement is illustrated in FIG. 5 with respect to clip array 120.

Siderails 122, 132, are along a perimeter of clip arrays 120, 130, such as surrounding clips of a mold block 104 to provide support to their substrates as well as facilitate alignment of clip arrays 120, 130 and leadframes 112 within a mold cavity. Likewise, the leadframe strip substrate 110 may also include a siderail along a perimeter of the array of leadframes 112, such as surrounding the array of leadframes 112, or a subset of the array of leadframes 112 for each mold block 104. Such siderails may be integrated elements of clip arrays 120, 130, and optionally, leadframe strip substrate 110 in that the siderails are formed from a common substrate with the other elements of clip arrays 120, 130, and optionally, leadframe strip substrate 110. The siderails (such as siderails 122, 132) for an array of leadframes and clip arrays include features, such as through-holes and/or notches, to facilitate mutual alignment for manufacturing process steps prior to molding and singulation.

Siderails 122, 132 each include multiple straight segments arranged in a rectangle, with reliefs 126, 136 within the front segments 124, 134 of the siderails. The rectangle surrounds a subset of the array of leadframes 112. In the particular example shown in the figures, the multiple straight segments of siderails 122, 132 are free of reliefs except for front segments 124, 134. For this reason, clip arrays 120, 130 are configured to be positioned within a mold cavity with front segments 124, 134 adjacent the mold gate area. In other examples, additional segments of the siderails may also include reliefs. Such other examples would provide additional mold compound flow path area past any such siderail segment with reliefs.

Restrictions in the flow path of the mold compound may cause excessive flow pressure leading to mold flash. The mold flash is particularly problematic if it covers electrical contacts intended to be exposed in a completed package. Mold flash is generally undesirable as affected packaged electronic assemblies may require reprocessing to remove the mold flash, or even outright rejection, increasing the unit cost and/or failure rate of the manufacturing process. However, as best shown in FIG. 1C, front segments 124, 134 of siderails 122, 132 each include a repeating pattern of reliefs 126, 136 which provide an increased mold compound flow path area at siderails 122, 132 as compared to siderails without reliefs 126, 136. In this manner, reliefs 126, 136 can serve to reduce pressure buildup and resulting mold flash during a transfer molding process for packaged electronic assemblies. As siderails 122, 132 are removed during singulation after the molding process, the components of singulated packages 106 are not altered except for the mold compound, which may be characterized by the absence of mold flash, for example.

FIG. 1C illustrates a side view of subassembly 102 showing a portion of front segments 124, 134 of siderails 122, 132. Front segments 124, 134 of siderails 122, 132 include repeating patterns of reliefs 126, 136 extending from outer edges 125, 135 of siderails 122, 132 to inner edges 127, 137 of siderails 122, 132, the inner edges 127, 137 being adjacent to clips of clip arrays 120, 130, as well as adjacent to the array of leadframes 112 within the subassembly 102, as shown in FIG. 1B. In the illustrated example, reliefs 126, 136 provide consistent profiles between outer edges 125, 135 of siderails 122, 132 to inner edges 127, 137 of siderails 122, 132. Examples with complex profiles are also contemplated.

Reliefs 126 in front segment 124 of siderail 122 of top clip array 120 may provide a significantly increased mold compound flow path area as compared to siderails without reliefs 126. The dimensions of reliefs 126 and lands 128 are selected to maintain suitable structural stability for clip array 120 while providing sufficient mold compound flow path area past siderail 122 to mitigate pressure buildup and undesirable mold flash during a transfer molding process. For example, the combined widths, one of which is indicated by reference number 152, of reliefs 126 may cover at least a third of a total length of front segment 124. More particularly, the combined widths of reliefs 126 may cover at least half, or even at least three-quarters of a total length of front segment 124. Lands 128 cover the spaces between adjacent reliefs 126 as well as other full-thickness portions of front segment 124 of siderail 122. The width of one land 128 is indicated by reference number 154. In some examples, reliefs 126 and lands 128 may form a regular repeating pattern with intervals of length 156.

In addition to the combined widths of reliefs 126, depth 158 of reliefs 126 are likewise significant to the mold compound flow path area provided by reliefs 126. In some particular examples, the depths 158 of reliefs 126 may be at least a third of a thickness 160 of the substrate used to form clip array 120. More particularly, the depths of reliefs 126 may be at least half of a thickness 160 of the substrate used to form clip array 120. In various examples, thickness 160 may be 2.5 mils, 4 mils, or 5 mils. In some examples, depth 158 of reliefs 126 may be selected to be approximately half of the thickness 160.

The proportional dimensions described with respect to reliefs 126 and lands 128 of front segment 124 of siderail 122 of top clip array 120 may also be applicable to reliefs 136 and lands 138 of front segment 134 of siderail 132 of bottom clip array 130. However, it is not necessary for both top clip array 120 and bottom clip array 130 to include reliefs. It is also not necessary for reliefs in top clip array 120 and bottom clip array 130 to be the same size. In some examples, top clip array 120 and bottom clip array 130 may include reliefs of differing sizes and or shapes. In other examples, only one of top clip array 120 and bottom clip array 130 may include reliefs as any increase in the mold compound flow path area past siderails 122, 132 may mitigate pressure buildup and undesirable mold flash to some degree.

The distance between outer edges 125, 135 of siderails 122, 132 to inner edges 127, 137 of siderails 122, 132 is also significant to the structural stability for clip array 120. In some examples, this distance may be between 0.5 millimeters (mm) to 5.0 mm, such as between 1.0 mm to 3.0 mm, such as 1.5 mm.

Clip arrays 120, 130 may be photoetched components. Processes for forming clip arrays 120, 130 may include photoetching a metal substrate such as flat sheet of material made out of either copper or iron-nickel alloys (such as alloy 42). For example, such processes may include coating the substrate with photo-resist film, and exposing the photoresist with a light source, such as an ultraviolet source) and a precision pattern film. The light source develops the photoresist over the areas for etching, with the undeveloped resist protecting the leadframe design parts during the etching. Portions of the etched leadframe may then be plated, e.g., with silver to facilitate solder connections.

Reliefs 126, 136 may be formed as part of the standard manufacturing process for clip arrays 120, 130. For example, in examples where clip arrays 120, 130 are formed by photoetching a metal substrate, reliefs 126, 136 may represent partial etches in the substantially consistent thickness of the metal substrate. Such a process provides a tapered bottom surface in reliefs 126, 136, rather than a sharp edge between a relief bottom and wall.

Alternatively, in examples where clip arrays 120, 130 are formed by stamping a metal substrate, reliefs 126, 136 may be formed by bending portions of the metal substrate forming the siderails. Such stamped examples may provide an undulating pattern with uneven top and bottom surfaces in the siderails proximate the reliefs. In yet further examples, reliefs 126, 136 may be formed by machining to remove portions of the metal substrate.

In the example of subassembly 102, substrate 110 of leadframes 112 does not include reliefs as those included in clip arrays 120, 130. However, in other examples, substrate 110 may also incorporate reliefs to increase the mold compound flow path area past front segments 124, 134 of siderails 122, 132 as an alternative or in addition to reliefs 126, 136 of clip arrays 120, 130.

FIG. 2A is a perspective view of semiconductor package strip 100 with four mold blocks 104 formed in a transfer molding process that includes overmolding subassembly 102 with mold compound 202. Each mold block 104 includes an array of leadframes 112 that correspond to an array of packages 106 following singulation. Compared to FIG. 1A, FIG. 2A illustrates the opposite side of subassembly 102, with pads 114 of leadframes 112 showing through mold compound 202. Also shown are exposed electrical contacts of leads 118 with the absence of undesirable mold flash on these electrical contacts. FIG. 2B is an enlarged perspective view of a portion of the semiconductor package strip 100 illustrating mold compound 202 within reliefs 126, 136 in siderails 122, 132 resulting from the transfer molding process. Siderails 122, 132 of clip arrays 120, 130 are shown in hidden lines as they are covered by mold compound 202 within a mold block 104.

As described previously, front siderail segments 124, 134 of siderails 122, 132, forms sets of reliefs 126, 136 extending from an outer edge of siderails 122, 132 to an inner edge of siderails 122, 132. As a result of the transfer molding process, mold compound 202 of the mold blocks 104 extends within reliefs 126, 136 of siderails 122, 132. In addition, mold blocks 104 are substantially free of mold flash on exposed electrical contacts of leads 118 (FIG. 2B) of the array of leadframes 112.

In some examples, substantially free of mold flash may mean an amount of mold flash not requiring reprocessing to remove the mold flash from electrical contacts of affected packaged electronic assemblies or outright rejection of affected packaged electronic assemblies. In the same or different examples, substantially free of mold flash may mean there is not additional mold flash on packages 106 adjacent to front siderail segments 124, 134 as compared to packages 106 that are not adjacent to front siderail segments 124, 134. For example, transfer molding processes of such examples may include removing some amount of mold flash from some or all of packages 106 through processing while not requiring extra processing or rejection of packages 106 adjacent to front siderail segments 124, 134.

Figure 3B:
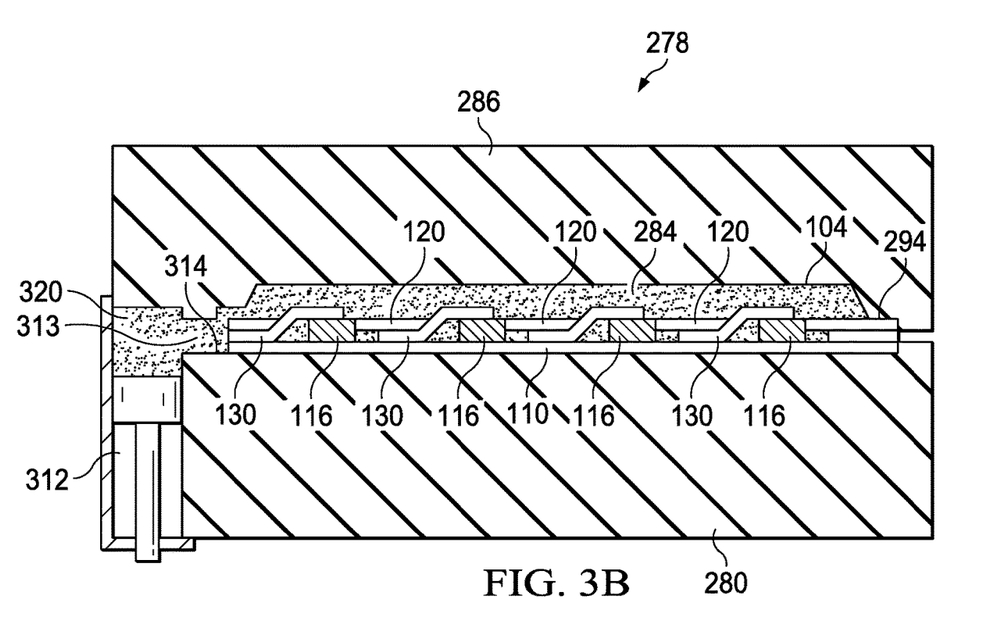

FIGS. 3A and 3B are schematic diagrams providing a cross sectional view of a transfer mold press 278 during a transfer molding process including subassembly 102 (FIG. 1A). Transfer mold press 278 has a bottom mold chase 280 and a top mold chase 286. Top mold chase 286 defines mold cavity 284 of transfer mold press 278.

Mold cavity 284 is adapted to receive subassembly 102 (FIG. 1A). Positioning subassembly 102 within mold cavity 284 includes positioning leadframe substrate 110, bottom clip array 130 and top clip array 120 in a stacked arrangement within mold cavity 284 on bottom mold chase 280. Bottom mold chase 280 is relatively flush to conform with subassembly 102. Leadframe substrate 110 may be covered with a film or tape on its surface adjacent bottom mold chase 280 to restrict the flow of mold compound on those surfaces and prevent covering electrical contacts of leads 118 with mold compound 202. Mold flash may occur on leadframe substrate 110 when the pressure in the gate area, the area proximate mold cavity gate 314, is sufficient to overcome the protection of the film or tape covering the surface of leadframe substrate 110 adjacent bottom mold chase 280.

Transfer mold press 278 comprises a mold pot 312 having a plunger 316. Plunger 316 moves in direction 318 to move molten mold compound 320 from the mold pot 312 into plunger 316. Fluid passageway 313 is in fluid communication with the mold pot 312, which is connected to mold cavity gate 314. Thus, as illustrated in FIG. 3B, molten mold compound 320 flows from the mold pot 312 through passageway 313 and mold cavity gate into mold cavity 284. As the molten mold compound 320 enters mold cavity 284, the flow path includes reliefs 126, 136 in siderails 122, 132 of clip arrays 120, 130 respectfully. This configuration limits flow path restrictions in the area of cavity gate 314 to mitigate pressure buildup and resulting mold flash. Mold compound 320 fills mold cavity 284 and discharges through vents (not shown) in mold cavity 284.

When mold compound 320 solidifies, e.g., by cooling and/or chemical processes, mold block 104 is formed in mold cavity 284. Mold block 104 partially covers leadframes 112 and dies 116 within mold cavity 284. As a result of the transfer molding process, mold compound 320 extends within reliefs 126, 136 of siderails 122, 132 (FIG. 2B), while mold blocks 104 are substantially free of mold flash on electrical contacts of leads 118 (FIG. 2B) of the array of leadframes 112.

Bottom and top mold chases 280, 286 are then separated and mold block 104 is removed from mold cavity 284.

In practice, transfer mold press 278 may include separate mold cavities corresponding to each of the mold blocks 104 of package strip 100. Each mold block 104 covers a number of semiconductor packages 106. Each semiconductor package 106 includes a leadframe 112, one or more dies 116, and electrical connections therebetween, at least some of which are provided by clip arrays 120, 130. Following the transfer molding process, the multiple semiconductor packages 106 are separated with a singulation process, such as sawing, leaving leads 118 exposed on the perimeters of the singulated packages 106, the exposed leads 118 serving as electrical contacts for packages 106, e.g., in a flat no-leads package configuration.

Figure 4:
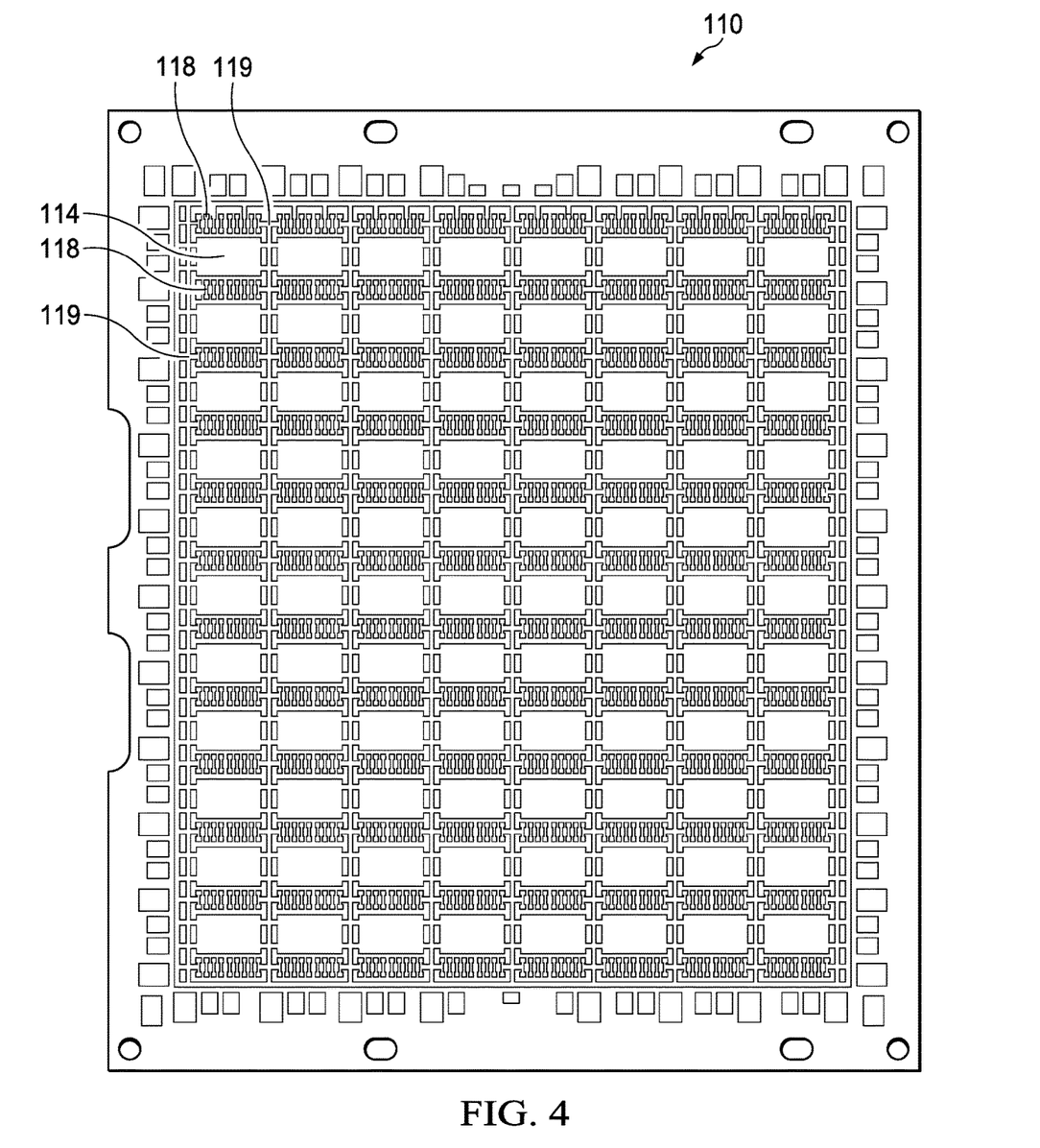
FIG. 4 is a top view of substrate with an array of leadframes for a single mold block.
Figure 6:
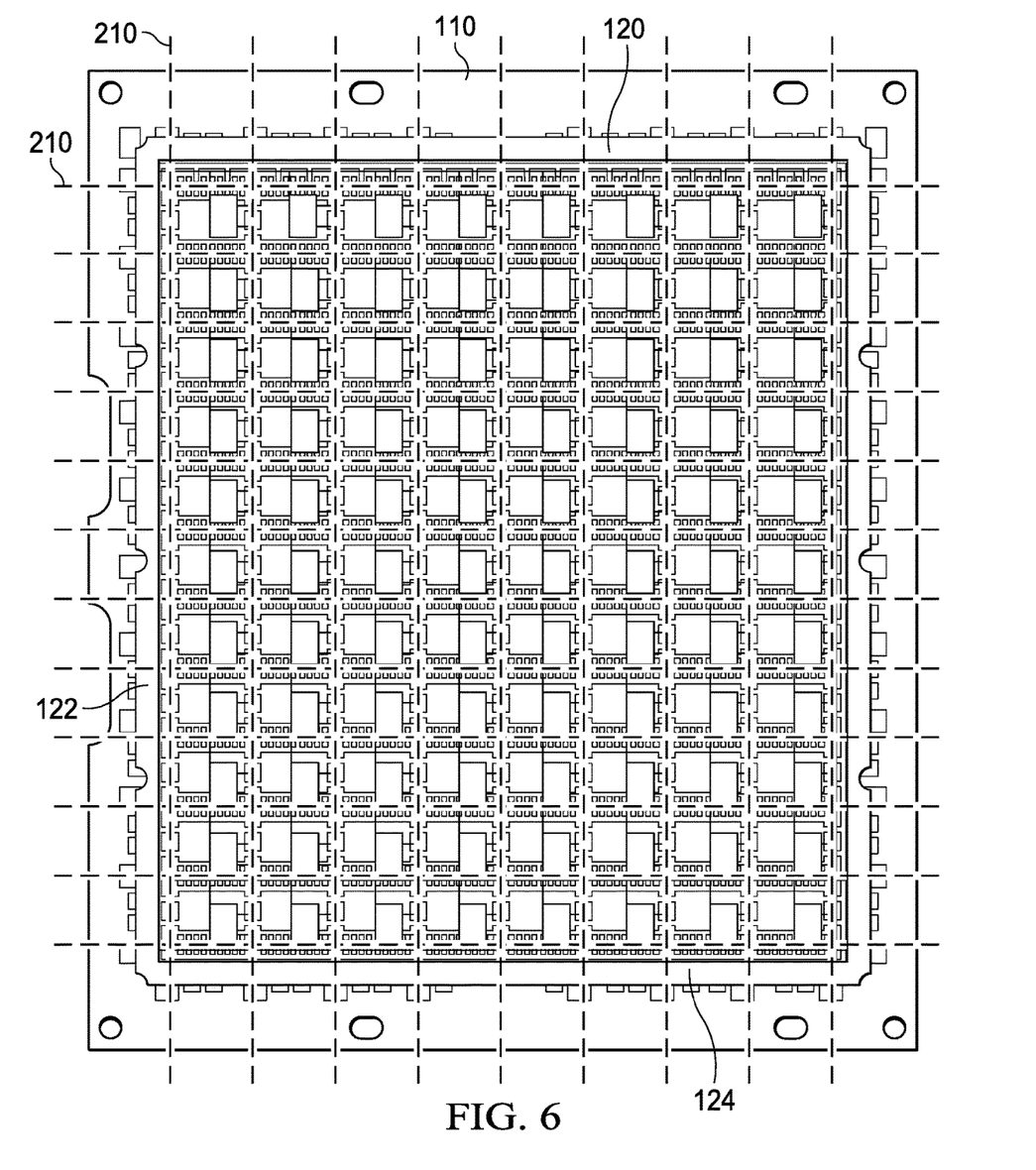
FIG. 6 is a top view of an assembly consisting of the substrate illustrated in FIG. 4 in alignment with the clip array illustrated in FIG. 5.

FIG. 4 is a top view of a portion of substrate 110 with an array of leadframes 112 for a single mold block 104. Likewise, FIG. 5 is a top view of a portion of clip array 120 for a single mold block 104. FIG. 6 is a top view of an assembly consisting of the portion of substrate 110 illustrated in FIG. 4 in alignment with the portion of clip array 120 illustrated in FIG. 5. FIG. 6 further illustrates cut lines 210, which represent locations for singulating individual packages 106 relative to substrate 110 and clip array 120.

As shown in FIG. 4 and discussed previously, substrate 110 forms pads 114 and leads 118 of leadframes 112. Substrate 110 further includes tie rails 119 connecting leads 118 of adjacent leadframes. Tie rails 119 are removed during singulation.

Similarly, as shown in FIG. 5, clip array 120 includes clips 121 and siderail 122. Adjacent clips 121 are connected by tie rails 129. Likewise, siderail 122 is connected to adjacent clips 121 with tie rails 129. Tie rails 129 are removed during singulation. Tie rails 129 interconnect adjacent clips 121 and connect clips 121 and siderail 122.

FIG. 6 illustrates substrate 110 in alignment with clip array 120 as it would be positioned within a mold cavity. Following molding, clip array 120 remains in this alignment with substrate 110. Tie rails 119 overlap tie rails 129 such that singulation of the mold block 104 (not shown in FIG. 6) along cut lines 210 separates adjacent clips 121 and adjacent leadframes 112 simultaneously to order to form singulated packages 106. Singulation may include severing along cut lines 210 with a cutting tool, such as a saw or laser. Portions of mold block 104 including siderail 122 may be discarded following singulation.

Figure 7:
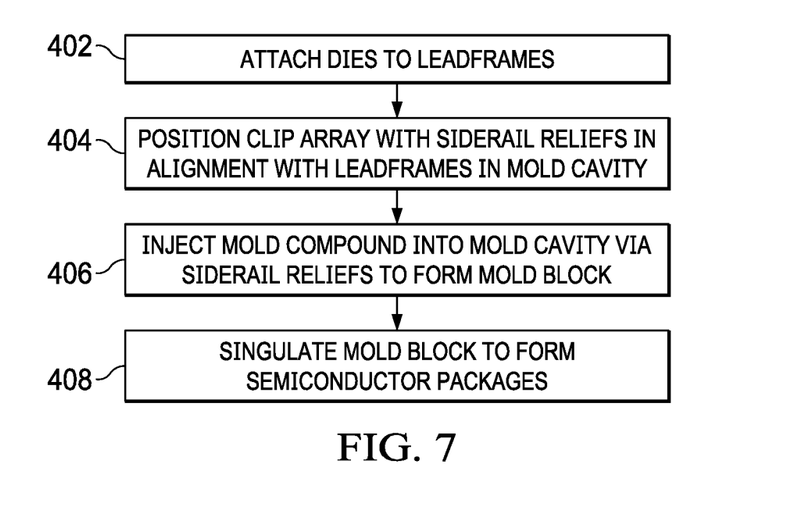
FIG. 7 is a flowchart of a method of manufacturing a semiconductor package strip.

FIG. 7 is a flowchart of a method of manufacturing a semiconductor package strip. For clarity, the techniques of FIG. 7 are described with respect to semiconductor package strip 100 including subassembly 102, mold blocks 104 and packages 106. The disclosed techniques are further described with respect to transfer mold press 278.

The method includes attaching semiconductor dies 116 to an array of leadframes 112 of substrate 110 (402). The method further includes positioning a clip array, such as at least one of clip arrays 120, 130, in alignment with the array of leadframes 112 within mold cavity 284 of transfer mold press 278 such that the clip array 120/130 provides electrical connections to at least some of the semiconductor dies 116 (404). The method optionally includes positioning a second clip array 120/130 in alignment with the array of leadframes 112 and the first clip array. As discussed previously, clip arrays 120, 130 each includes a siderail 122, 132 along its perimeter in the stacked assembly. Siderails 122, 132 each form a set of reliefs 126, 136 extending from an outer edge of the siderail to an inner edge of the siderail, the inner edge being adjacent to the array of leadframes 112.

The method includes injecting mold compound 202 into mold cavity 284 through a flow path including the set of reliefs of the siderail to form a mold block 104 at least partially covering the semiconductor dies 116 (406). Mold block 104 may be substantially free of mold flash on leads 118 of the array of leadframes 112 because the flow path, including the set of reliefs of the siderail, limited pressure buildup in mold cavity gate 314 during molding.

The method optionally includes singulating mold block 104 to form a set of individual semiconductor packages 106 separated from the siderail, each of the semiconductor packages 106 including one or more of the semiconductor dies 116 (408). In alternative examples, the mold block may only include a single semiconductor package such that singulation is not needed.

In some examples, the method may include performing a failure analysis of semiconductor packages 106 within the mold block 104 to ensure their functionality such failure analysis may include visual inspection for mold flash and/or electrical testing of packages 106 to verify their functionality according to defined specifications.

The specific techniques for transfer molding packages for electronic assemblies including clip arrays with siderail reliefs described herein are merely illustrative of the general inventive concepts included in this disclosure as defined by the following claims.

What is claimed is:

1. A method of manufacturing a semiconductor package comprising:
    attaching semiconductor dies to an array of leadframes;
    positioning a clip array in alignment with the array of leadframes within a mold cavity, the clip array including clips that electrically connect to at least some of the semiconductor dies and a siderail along a perimeter of the clip array,
    wherein the siderail forms a set of reliefs extending from an outer edge of the siderail to an inner edge of the siderail, the inner edge being adjacent to the array of leadframes; and
    injecting a mold compound into the mold cavity through a flow path including the set of reliefs of the siderail to form a mold block at least partially covering the semiconductor dies.

2. The method of claim 1, wherein the siderail includes multiple straight segments arranged in a rectangle surrounding the clips of the clip array.

3. The method of claim 2, wherein the multiple straight segments arranged in the rectangle are free of reliefs except for the one segment of the siderail.

4. The method of claim 1, wherein combined widths of reliefs of the set of reliefs cover at least a third of a length of one segment of the multiple straight segments.

5. The method of claim 1,
    wherein the clip array is formed from a substrate providing a thickness, and
    wherein reliefs of the set of reliefs provide depths of at least a third of the thickness of the substrate.

6. The method of claim 1,
    wherein the clip array is a first clip array, and the siderail is a first siderail,
    the method further comprising positioning a second clip array in a stacked arrangement relative to the first clip array within the mold cavity, the second clip array including a second siderail stacked relative to the first siderail in the stacked arrangement,
    wherein the set of reliefs is a first set of reliefs, and
    wherein the second siderail forms a second set of reliefs, wherein the flow path of the mold compound also includes the second set of reliefs.

7. The method of claim 1,
    wherein the siderail is one of a set of siderails of the semiconductor package and each of the set of siderails surrounds a subset of the array of leadframes, wherein the set of reliefs is a first set of reliefs, and each of the set of siderails includes additional sets of reliefs, and wherein injecting the mold compound into the mold cavity includes injecting the mold compound into the mold cavity through the reliefs of each of the set of siderails to form a set of mold blocks including the mold block.

8. The method of claim 1, further comprising, prior to positioning the clip array in alignment with the array of leadframes within the mold cavity, photoetching a substrate to form the clip array including the siderail, wherein the photoetching includes partially etching the set of reliefs in the substrate.

9. The method of claim 1, wherein injecting the mold compound to form the mold block includes injecting the mold compound to form the mold block such that the mold block is substantially free of mold flash on leads of the semiconductor package.

10. The method of claim 1, further comprising singulating the mold block to separate the semiconductor package from the siderail and from other semiconductor packages contained within the mold block, the semiconductor package including one or more of the semiconductor dies and one or more of the clips.

11. The method of claim 1, further comprising performing a failure analysis of the semiconductor package, the semiconductor package including one or more of the semiconductor dies.

12. A method of manufacturing a semiconductor package comprising:

injecting a mold compound into a mold cavity through a flow path to form a mold block, the mold cavity containing:

semiconductor dies attached to an array of leadframes, and a clip array in alignment with the array of leadframes, the clip array including clips that electrically connect to at least some of the semiconductor dies and a siderail along a perimeter of the clip array, wherein the siderail includes multiple straight segments arranged in a rectangle surrounding the clips of the clip array, the siderail forming a set of reliefs extending from an outer edge of the siderail to an inner edge of the siderail, the inner edge being adjacent to the array of leadframes, wherein the flow path includes the set of reliefs of the siderail, and the mold block at least partially covers the semiconductor dies; and singulating the mold block to separate the semiconductor package from the siderail and from other semiconductor packages contained within the mold block, the semiconductor package including one or more of the semiconductor dies and one or more of the clips.

13. The method of claim 12, further comprising, prior to injecting the mold compound into the mold cavity, photoetching a substrate providing a thickness to form the clip array including the siderail, wherein the photoetching includes partially etching the set of reliefs in the substrate to depths of at least a third of the thickness of the substrate.

14. The method of claim 12, wherein injecting the mold compound to form the mold block includes injecting the mold compound to form the mold block such that the mold block is substantially free of mold flash on leads of the semiconductor package.

15. The method of claim 12, wherein the semiconductor package is a quad-flat no-leads package.

16. A semiconductor package clip structure comprising:

a clip array formed from a substrate providing a thickness, the clip array including:

clips interconnected in an array; and a siderail along a perimeter of the clip array, wherein the siderail forms a set of reliefs extending from an outer edge of the siderail to an inner edge of the siderail, the inner edge being adjacent to the clips, wherein reliefs of the set of reliefs are partial etches in the substrate, wherein the siderail includes multiple straight segments arranged in a rectangle, wherein the reliefs provide depths of at least a third of the thickness of the substrate, and wherein combined widths of the reliefs cover at least a third of a length of one segment of the multiple straight segments.

17. The semiconductor package clip structure of claim 16, wherein the multiple straight segments arranged in the rectangle are free of reliefs except for the one segment of the siderail.

18. The semiconductor package clip structure of claim 16, wherein the clip array is divided into sections for more than one mold block, the sections including different subsets of the clips, the siderail being along the perimeter of one of the sections, with additional siderails surrounding clips of other sections of the sections.

19. The semiconductor package clip structure of claim 18, wherein each of the additional siderails include reliefs.

20. The semiconductor package clip structure of claim 16, further comprising tie rails interconnecting the clips in the array and connecting the clips to the siderail.

* * * * *